(12) United States Patent
Tam et al.

(10) Patent No.: US 9,991,194 B1
(45) Date of Patent: Jun. 5, 2018

(54) SENSOR PACKAGE AND METHOD OF MANUFACTURE

(71) Applicant: Ubotic Company Limited, Hong Kong (CN)

(72) Inventors: Ming-Wa Tam, Hong Kong (CN); Ken Lik Hang Wan, Hong Kong (CN); Wa San Leung, Hong Kong (CN)

(73) Assignee: UBOTIC COMPANY LIMITED, Tsuen Wan, Hong Kong (CN)

( * ) Notice: Subject to any disclaimer, the term of this patent is extended or adjusted under 35 U.S.C. 154(b) by 0 days. days.

(21) Appl. No.: 15/490,632

(22) Filed: Apr. 18, 2017

(51) Int. Cl.
*H01L 23/495* (2006.01)
*H01L 23/00* (2006.01)
*H01L 23/29* (2006.01)
*H01L 23/498* (2006.01)
*H01L 21/48* (2006.01)

(52) U.S. Cl.
CPC .... *H01L 23/49586* (2013.01); *H01L 21/4842* (2013.01); *H01L 23/293* (2013.01); *H01L 23/4952* (2013.01); *H01L 23/49579* (2013.01); *H01L 23/49861* (2013.01); *H01L 24/97* (2013.01)

(58) Field of Classification Search
CPC ............. H01L 23/49861; H01L 23/498; H01L 21/4842; H01L 21/48; H01L 23/293; H01L 23/29; H01L 24/97; H01L 23/00; H01L 23/49579; H01L 23/495; H01L 23/4952; H01L 2221/68327; H01L 2223/54473; H01L 2223/5446; H01L 2223/5448
See application file for complete search history.

(56) References Cited

U.S. PATENT DOCUMENTS

| | | | | |
|---|---|---|---|---|
| 8,212,340 | B2* | 7/2012 | Liao | H01L 21/561 257/660 |
| 2009/0236704 | A1* | 9/2009 | Camacho | H01L 23/49541 257/670 |
| 2012/0025361 | A1* | 2/2012 | Ito | H01L 23/047 257/676 |
| 2015/0262918 | A1* | 9/2015 | Tran | H01L 21/4842 257/676 |
| 2016/0336232 | A1* | 11/2016 | Hsieh | H01L 25/072 |

* cited by examiner

*Primary Examiner* — Yasser A Abdelaziez
(74) *Attorney, Agent, or Firm* — Keating and Bennett, LLP

(57) ABSTRACT

A method of manufacture and a substrate for sensor packages is provided. The method involves premolding a lead frame with strips having V-grooves; cutting the substrate partially, and plating the exposed surfaces of the lead frame. The method subsequently involves attaching a die to a dies pad and connecting wires between the die and leads to form a sensor package. The sensor package is separated from the substrate by snapping along the score line. The substrate for assembly of sensor packages as well as substrate of sensor packages is manufactured using at least part of the method of manufacture.

20 Claims, 14 Drawing Sheets

1-1

2-2

3-3

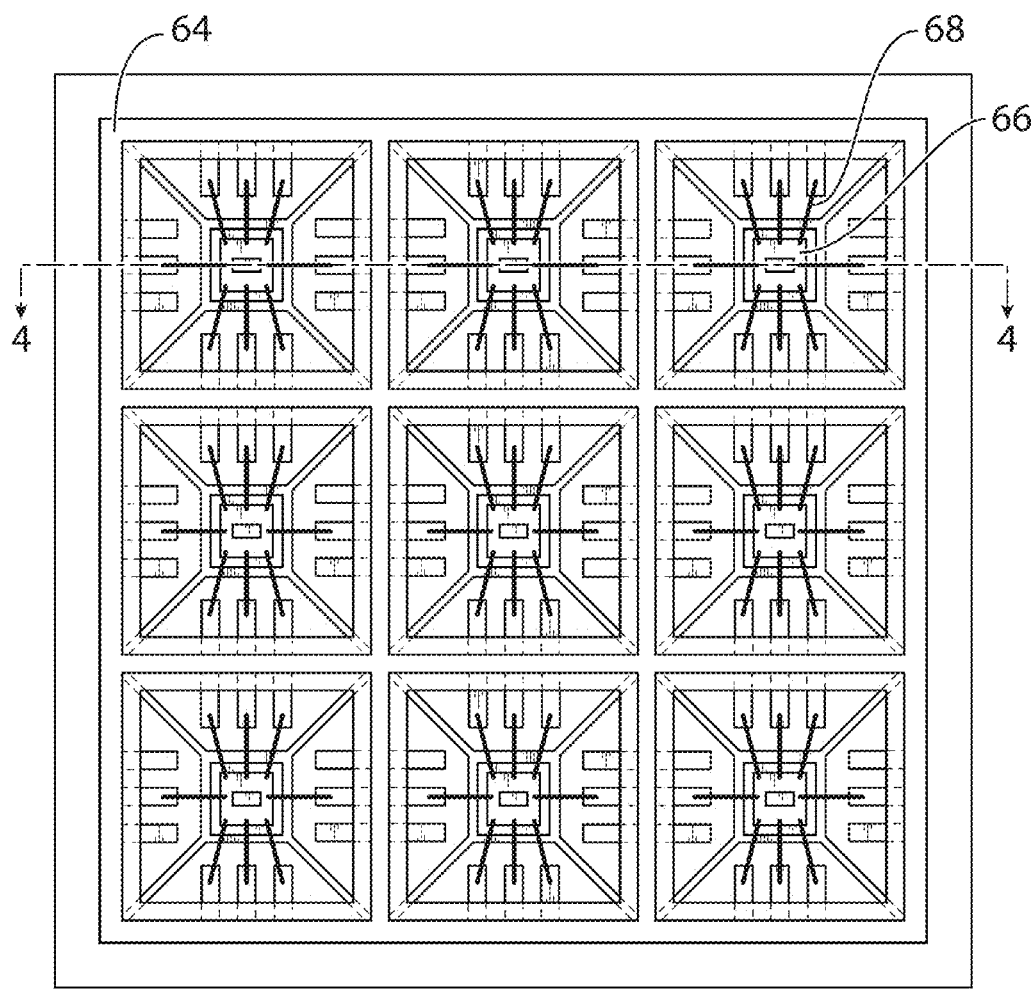
PRIOR ART FIG. 4A
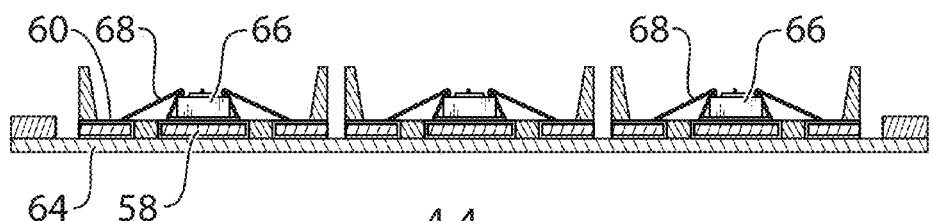
PRIOR ART FIG. 4B

7-7

13-13

SENSOR PACKAGE AND METHOD OF MANUFACTURE

FIELD

The present invention relates generally to semiconductor packages, and more particularly to a substrate of sensor packages and a method of manufacture.

BACKGROUND

Sensor packages are known and are generally assembled onto a lead frame structure along with several other sensor packages in close proximity, such as on a substrate. The lead frame provides electrical interconnections to a semiconductor die. In general, the die is attached to a lead frame and then bonding pads of the die are electrically connected to leads of the lead frame, typically with wires using a wire bonding process. The assembled sensor packages must be separated at some point such that they can be individually implemented into various systems or circuit boards.

FIGS. 1 to 4 illustrate a known method of assembling sensor packages. FIG. 1 illustrates a metal lead frame 50 having plated with a wire bondable material 52. FIG. 2 shows the plated lead frame 50 premolded with a molding compound 54. The molding compound forms cavities 56, where each cavity 56 includes an exposed die pad 58 and exposed leads 60. The cavities 56 are separated by strips of molding compound 54. The cavities are then singulated using a saw making cuts 62 as shown in FIG. 3. In general, the cutting process generates dust and heats up the saw blade. Accordingly, pressurized water or some other means would need to be used to cool the blade and removed the dust.

After the water is removed from the singulated units, the units are reconstituted onto a temporary carrier 64 for further assembly. A die 66 is attached to the die pad 58 and wires 68 are bonded to the die 66 and the leads 60 to form an electrical connection. After final assembly, the sensor packages are removed from the temporary carrier 64 for installation on a board or other device.

SUMMARY

In accordance with an aspect of the invention, there is provided a method of manufacturing a sensor package. The method involves premolding a lead frame to form substrate having a plurality of cavities. Each cavity includes exposed surfaces, and adjacent cavities of the plurality of cavities are separated with a strip disposed on a first side of the substrate. The strip is formed with a longitudinal groove. In addition, the method involves cutting partially along the strip from a second side of the substrate to form a score line, the second side opposite the first side, such that the adjacent cavities remain connected. Furthermore, the method involves plating the exposed surfaces with a bondable metal. The exposed surface includes leads, a die pad, and walls of the score line. The method also involves attaching a die to the die pad. The method further involves connecting wires between the die and the leads to form the sensor package. Also, the method involves snapping the substrate along the score line to separate the sensor package.

The lead frame may include copper.

The lead frame may include an iron/nickel alloy.

Premolding may involve applying an epoxy molding compound.

Premolding may involve applying a liquid crystal polymer.

Plating may involve electroless plating.

The bondable metal may include at least one of gold, nickel, and silver.

The method may further involve attaching a lid to protect the sensor package. The lid may be supported by the strip.

Attaching the lid may involve using epoxy.

Attaching the lid may involve using ultrasonic welding.

The lid may include a via for exposing the die of the sensor package to an external environment.

The method may further involve applying an encapsulation polymer to protect the wires and the die.

In accordance with another aspect of the invention, there is provided a substrate for assembly of sensor packages. The substrate includes a lead frame. In addition, the lead frame includes a premolding compound premolded to the lead frame defining a plurality of cavities. Each cavity includes exposed surfaces. Adjacent cavities of the plurality of cavities are separated with a strip disposed on a first side of the lead frame. The strip is formed with a longitudinal groove. The substrate further includes a score line cut along the strip from a second side of the lead frame, the second side opposite the first side. The score line is configured to facilitate separation of the sensor packages by snapping. In addition, the substrate includes a bondable metal plated onto exposed surfaces of the lead frame, wherein the exposed surfaces include leads, a die pad in each cavity of the plurality of cavities, and walls of the score line, wherein the die pad is configured to receive a die, and wherein the leads are configured to connect to the die using wires.

In accordance with another aspect of the invention, there is provided a substrate of sensor packages. The substrate includes a lead frame. Furthermore, the substrate includes a premolding compound premolded to the lead frame defining a plurality of cavities. Each cavity includes exposed surfaces. Adjacent cavities of the plurality of cavities are separated with a strip disposed on a first side of the lead frame, wherein the strip is formed with a longitudinal groove. The substrate also includes a score line cut along the strip from a second side of the lead frame, where the second side is opposite the first side. The score line is configured to facilitate separation of the sensor packages by snapping. In addition, the substrate includes a bondable metal plated onto exposed surfaces of the lead frame. The exposed surfaces include leads, a die pad in each cavity of the plurality of cavities, and walls of the score line. The substrate also includes a die attached to the die pad. The substrate also includes wires connecting the die to the leads.

BRIEF DESCRIPTION OF THE DRAWINGS

Reference will now be made, by way of example only, to the accompanying drawings in which:

FIG. 4A is a top perspective view of a plurality of sensor packages on a temporary carrier in accordance with a prior art embodiment;

FIG. 4B is a cross sectional view of the prior art lead frame in accordance with the embodiment of FIG. 4A through the line 4-4;

DETAILED DESCRIPTION OF THE EMBODIMENTS

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

In describing the components of the frame and alternative versions, or embodiments, of some of these components, the same reference number can be used for elements that are the same as, or similar to, elements described in other versions or embodiments. As used herein, any usage of terms that suggest an absolute orientation (e.g. "top", "bottom", "front", "back", etc.) are for illustrative convenience and refer to the orientation shown in a particular figure. However, such terms are not to be construed in a limiting sense as it is contemplated that various components will, in practice, be utilized in orientations that are the same as, or different than those described or shown.

Figure 1A:
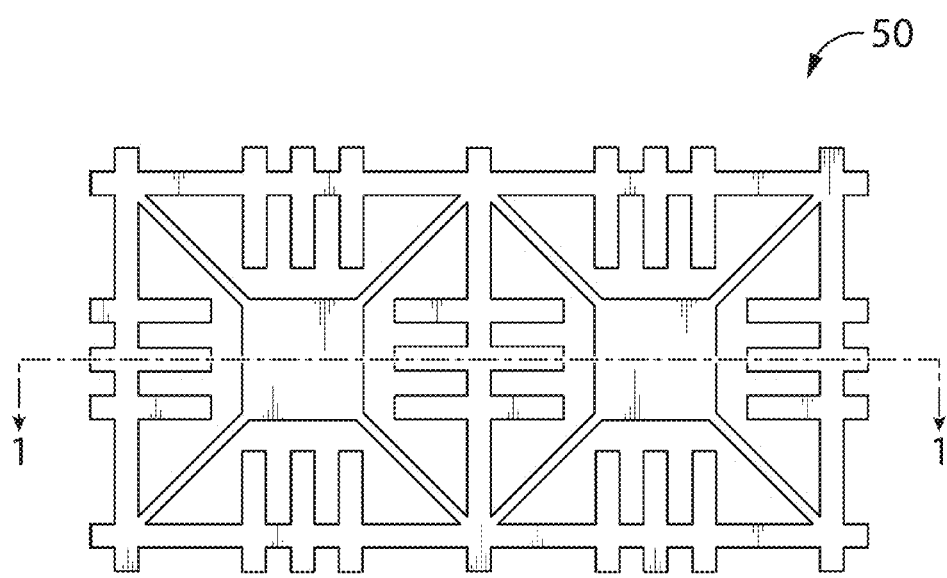
FIG. 1A is a top perspective view of a lead frame in accordance with a prior art embodiment.
Figure 1B:
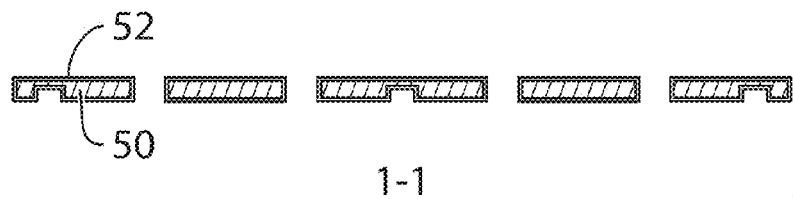
FIG. 1B is a cross sectional view of the prior art lead frame in accordance with the embodiment of FIG. 1A through the line 1-1.
Figure 2A:
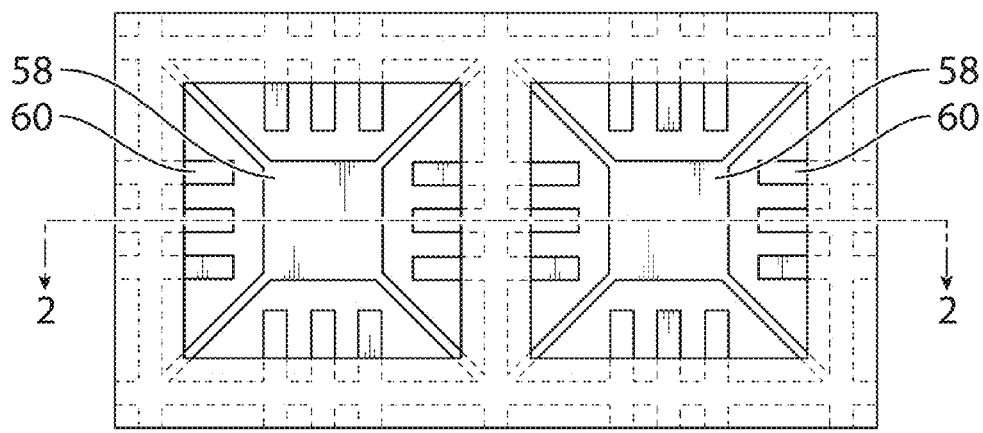
FIG. 2A is a top perspective view of a plated and premolded lead frame in accordance with a prior art embodiment.
Figure 2B:
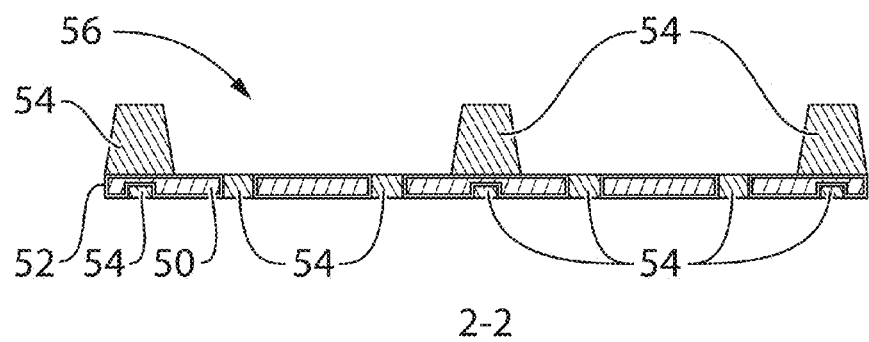
FIG. 2B is a cross sectional view of the prior art lead frame in accordance with the embodiment of FIG. 2A through the line 2-2.
Figure 3A:
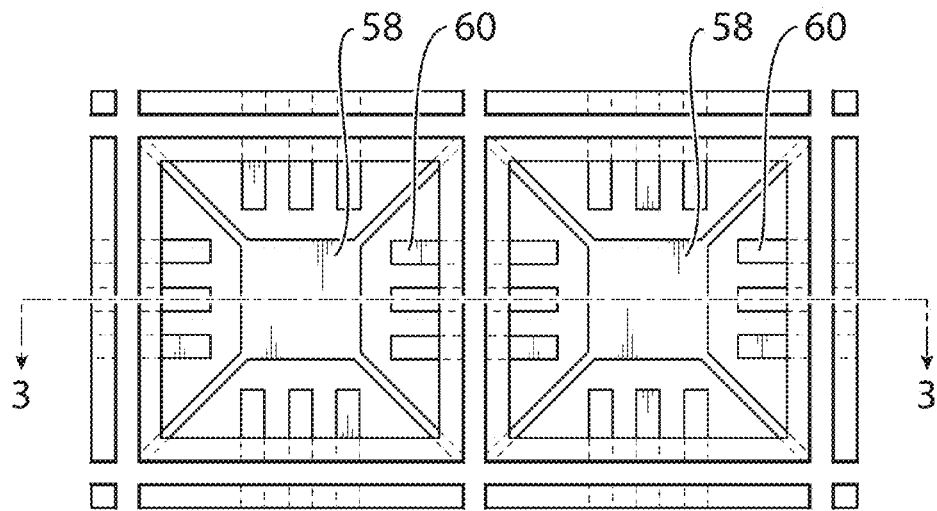
FIG. 3A is a top perspective view of a cut plated and premolded lead frame in accordance with a prior art embodiment.
Figure 3B:
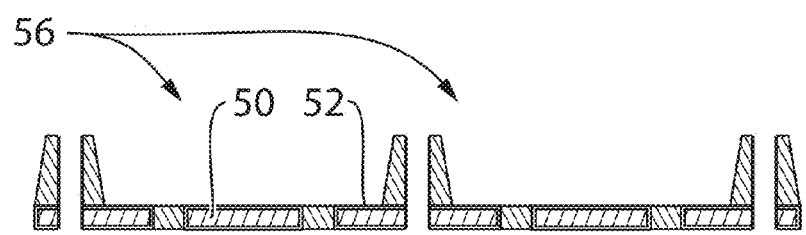
FIG. 3B is a cross sectional view of the prior art lead frame in accordance with the embodiment of FIG. 3A through the line 3-3.
Figure 5:
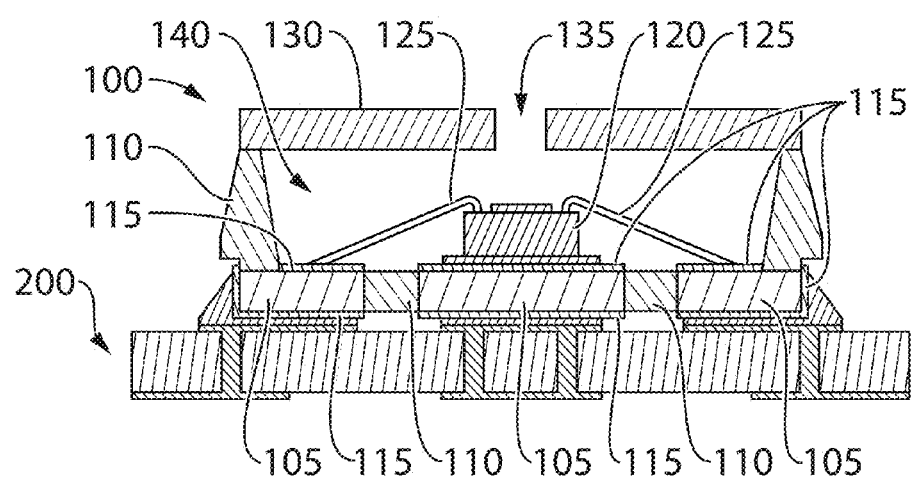
FIG. 5 is a cross sectional view of a sensor package in accordance with an embodiment.

Referring to FIG. 5, a sensor package is generally shown at 100 connected to a motherboard 200. It is to be understood that the sensor package 100 is purely exemplary and that it will become apparent to those skilled in the art that modifications to the sensor package 100 are contemplated. Examples of variations are discussed in greater detail below and various components can be substituted and/or added depending on the requirements of the sensor package 100. The sensor package 100 is generally configured to attached to a motherboard 200 and provide data collected to the motherboard. In the present embodiment, the sensor package 100 includes a lead frame 105 premolded with an premolding compound 110, metal plating 115, a die 120, at least one wire 125, and an optional lid 130 having a via 135.

It is to be appreciated that the sensor package is not particularly limited and can be any type of sensor. For example, the sensor can be a pressure sensor or a gas sensor. In some embodiments, the sensor may need to be exposed fully or partially to the environment for improved functionality. However, in other embodiments, the sensor can be covered or encased in a substance to protect the sensor from the elements.

Figure 6:
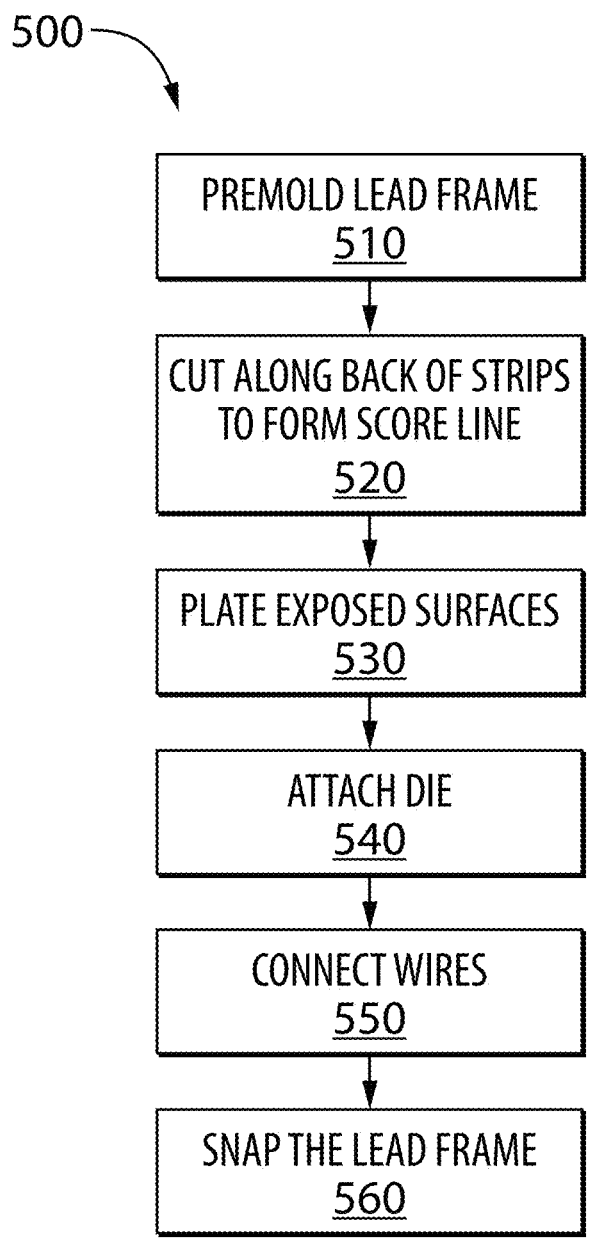
FIG. 6 is a flow chart of a method of manufacturing in accordance with an embodiment.

Referring to FIG. 6, a method manufacturing a sensor package is represented in the form of a flow-chart and indicated generally at 500. For illustrative purposes, it can be assumed the method 500 is implemented to manufacture the sensor package 100 described above. However, it is to be understood that the method 500 is not limited to the manufacture the sensor package 100 and can be implemented to manufacture other devices that are assembled on a substrate. Furthermore, the following discussion of the method 500 will lead to further understanding of the method manufacture the sensor package 100 and its various components. It is to be understood that the method 500 can be varied, and need not work exactly as discussed herein.

Figure 7A:
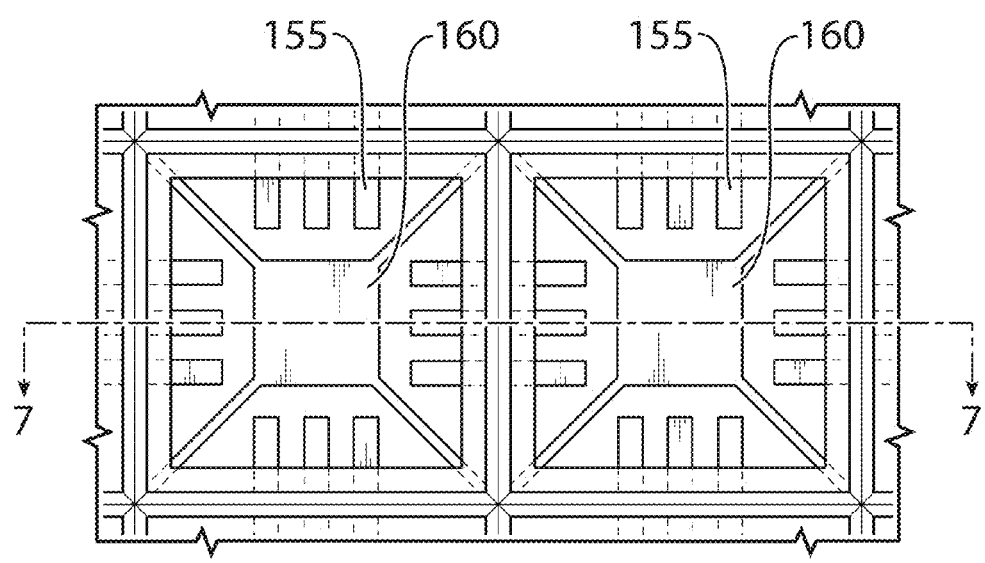
FIG. 7A is a top perspective view of a premolded lead frame in accordance with an embodiment.
Figure 7B:
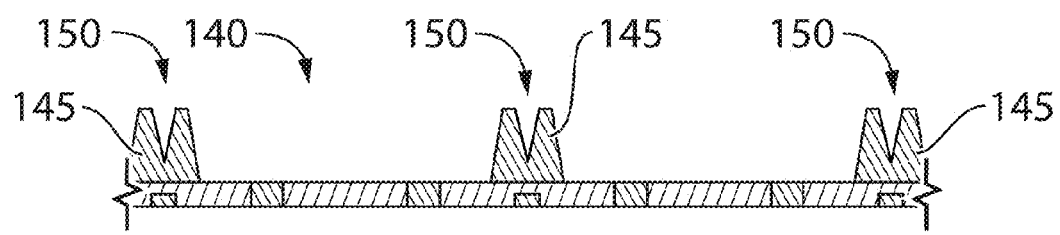
FIG. 7B is a cross sectional view of the lead frame in accordance with the embodiment of FIG. 7A through the line 7-7.

Beginning at block 510, a lead frame 105 is premolded using a premolding compound to form a substrate having a plurality of cavities 140 as shown in shown in FIGS. 7A and 7B. In the present embodiment, the lead frame 105 is made of copper for its electrical and mechanical properties. It is to be appreciated by a person of skill in the art with the benefit of this description that the material of the lead frame 105 is not particularly limited and that any other material with suitable electrical and mechanical properties can be used. For example, in other embodiments, the lead frame 105 can be an iron/nickel alloy such as Alloy 42 or aluminum.

The manner by which the lead frame 105 is premolded is not particularly limited. In the present embodiment, the lead frame 105 is premolded with a premolding compound 110 filling the gaps in the lead frame. The premolding leaves some exposed surfaces within the cavity 140. In particular, at least one lead 155 and a die pad 160 remain exposed in cavity. In the present embodiment, the premolding compound 110 is an epoxy molding compound. However, it is to be appreciated that the premolding compound 110 is not particularly limited and that other compounds can be used. For example, the premolding compound 110 can be a liquid crystal polymer or any other polymer or compound with the proper electrical and mechanical properties. In particular, the premolding compound 110 is generally an electrically insulating, physically hard, and brittle.

The premolding compound 110 forms strips 145 along the top surface to separate each cavity 140 from an adjacent cavity. The strips 145 include a V-groove 150 formed longitudinally as shown in FIG. 7B. It is to be appreciated by a person of skill in the art that the strips 145 are not particularly limited to any shape. In addition, the V-groove 150 can be modified to be another structure forming a valley on the strip 145.

Figure 8A:
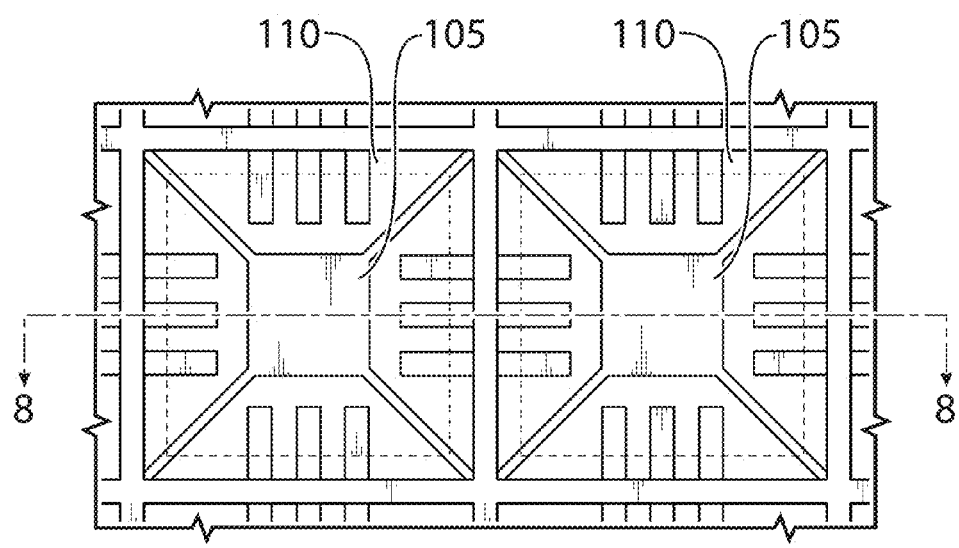
FIG. 8A is a top perspective view of the lead frame shown in FIG. 7A with a score line.
Figure 8B:
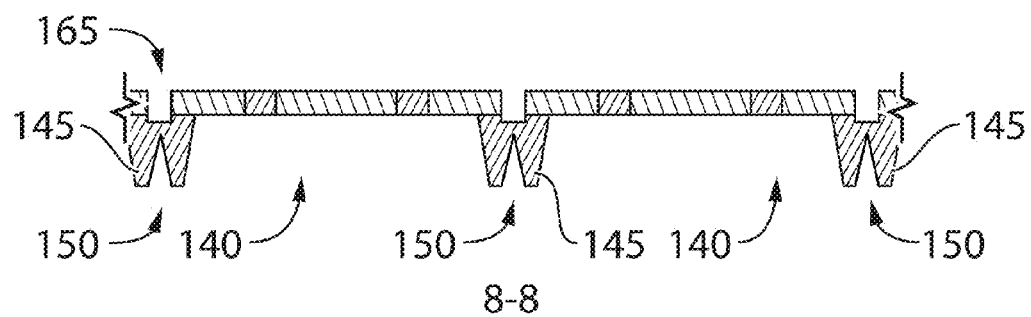
FIG. 8B is a cross sectional view of the lead frame in accordance with the embodiment of FIG. 8A through the line 8-8.

Block 520 involves cutting the bottom side of the substrate through the lead frame 105 and the premolding compound 110 as shown in FIGS. 8A and 8B to form a score line 165. It is to be appreciated that the score line 165 is opposite a V-groove 150 in the present embodiment to create a line which is structurally weakened compared to the surround portions. In particular, the cut does not go completely through the substrate. Instead the cut is only partially through the substrate such that adjacent cavities 140 remain connected. The manner by which the score line 165 is cut as well as the depth is not particularly limited. In the present embodiment, a saw blade can be used to cut the bottom side of the lead frame 105 into the premolding compound 110. In other embodiments, the score line 165 can be made with a diamond point or other scoring device, mechanical blade cutting, laser ablation, or an etching technique.

After cutting, exposed surfaces of the lead frame 105 is plated with a bondable metal plating 115 at block 530. In the present embodiment, the bondable metal plating 115 is plating of gold for its enhanced electrical conductivity and mechanical properties. It is to be appreciated by a person of skill in the art with the benefit of this description that the bondable metal plating 115 is not particularly limited and that any other material with suitable electrical and mechanical properties can be used. For example, in other embodiments, the bondable metal plating 115 can be silver, palladium, nickel, or any combination thereof.

Figure 9A:
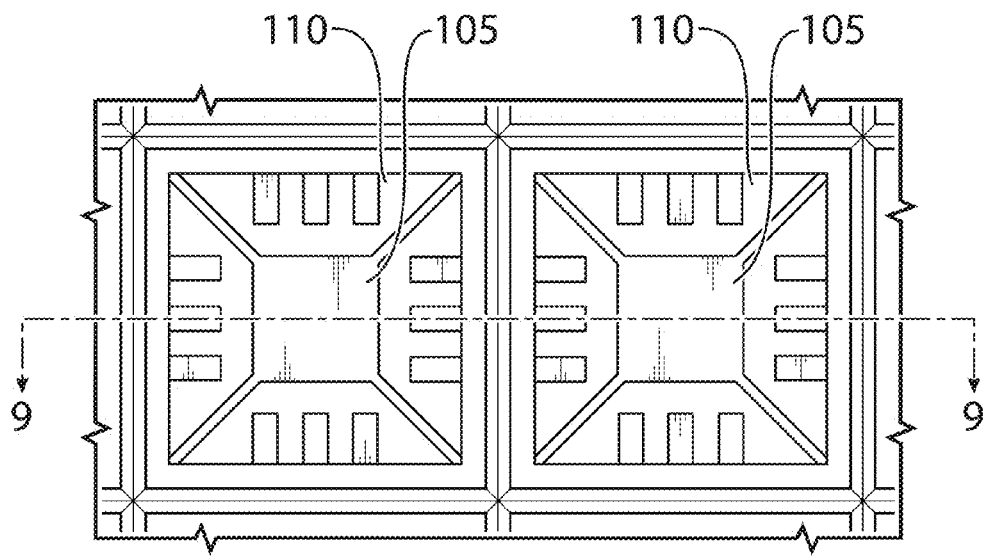
FIG. 9A is a top perspective view of the lead frame shown in FIG. 8A with a metal plating.
Figure 9B:
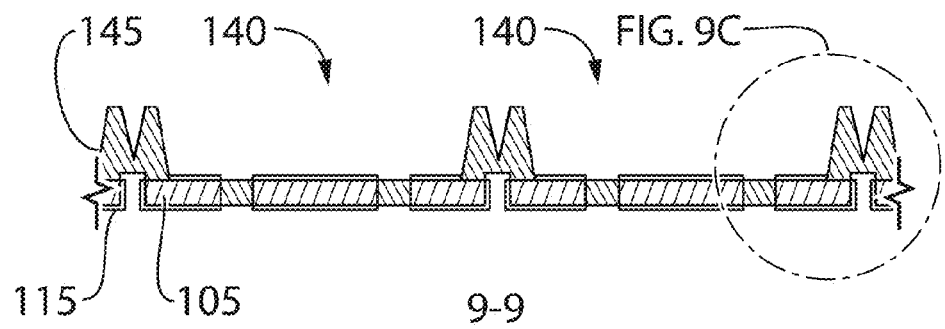
FIG. 9B is a cross sectional view of the lead frame in accordance with the embodiment of FIG. 9A through the line 9-9.
Figure 9C:
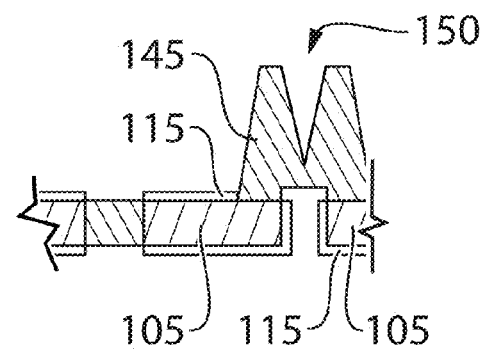
FIG. 9C is zoomed in view of a portion of FIG. 9B.

The manner by which the bondable metal plating 115 is plated is also not limited. In the present embodiment, an electroless plating technique is used, such as electroless nickel plating covered with a thin layer of immersion gold. In another embodiment, the metal plating 115 can be formed using electroless nickel plating followed by electroless palladium covered by a thin layer of immersion gold. In other embodiments, other plating techniques can be used such as electroplating, chemical vapor deposition, and sputtering techniques. The exposed surfaces include the leads 155, the die pad 160, and the walls of the score line 165 as shown in FIGS. 9A and 9B. It is to be appreciated that since the plating process is carried out after cutting in the present embodiment, the walls of the score line 165 can be plated as well.

Figure 10A:
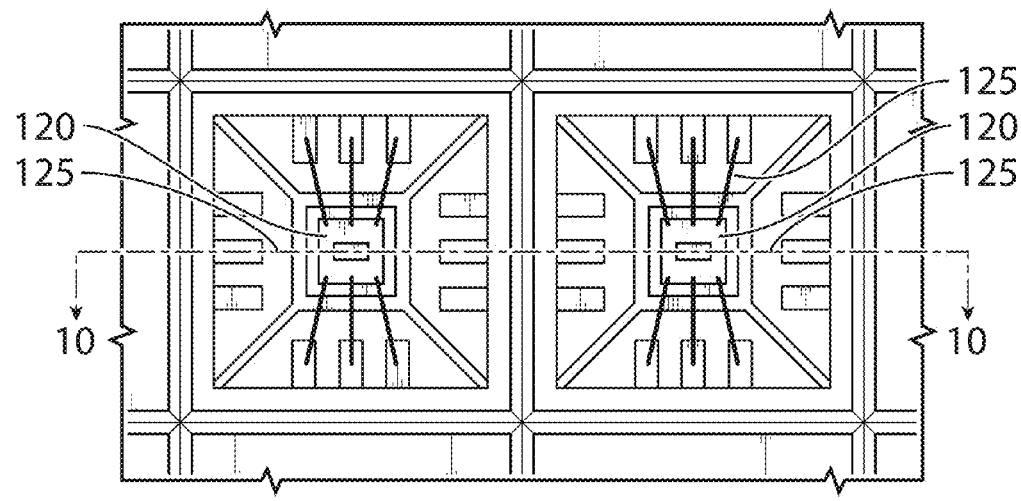
FIG. 10A is a top perspective view of sensor packages in accordance with an embodiment.
Figure 10B:
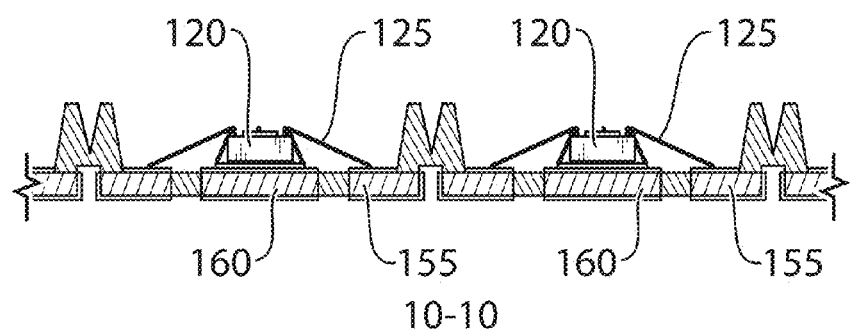
FIG. 10B is a cross sectional view of the sensor package in accordance with the embodiment of FIG. 10A through the line 10-10.

Next, blocks 540 and 550 involves attaching a die 120 to the die pad 160, and connecting the wires 125 between the die 120 and the leads 155 as shown in FIGS. 10A and 10B. In the present embodiment, the die 120 is mounted onto the die pad 160 using epoxy. It is to be appreciated that the manner by which the die 120 is mounted is not particularly limited and can include other known techniques suitable for the application. In the present embodiment, the wires 125 can be any suitable conductive material, such as gold, silver, copper, copper coated with palladium, and aluminum. The manner by which the wires 125 are bonded is not particularly limited and can be done using thermosonic or thermal compression or other known techniques suitable for the application Once connected to the lead frame 105, a sensor package 100 is formed within the cavity 140.

Figure 11A:
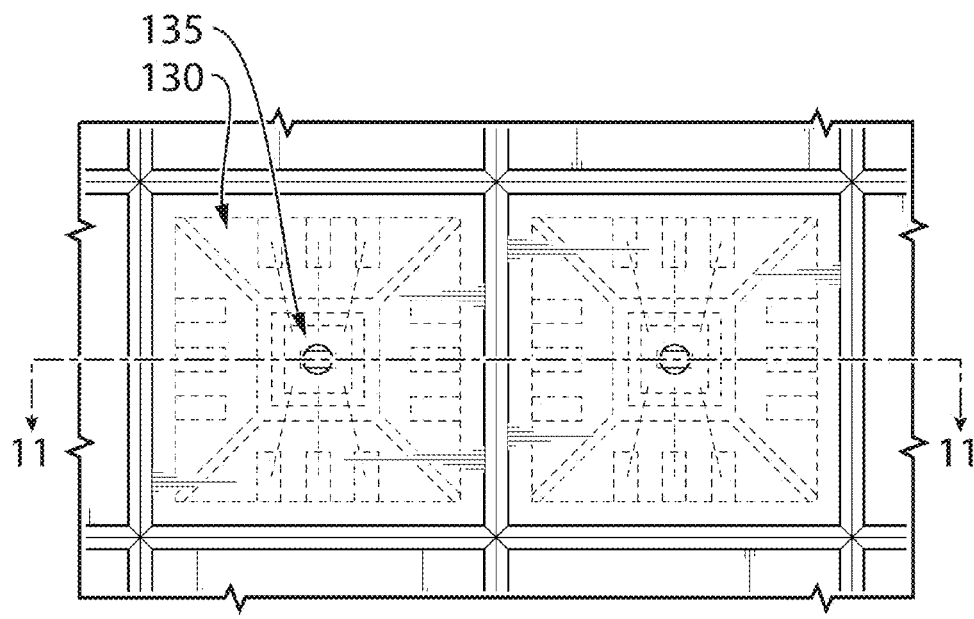
FIG. 11A is a top perspective view of the sensor packages show in FIG. 10A with a lid in accordance with an embodiment.
Figure 11B:
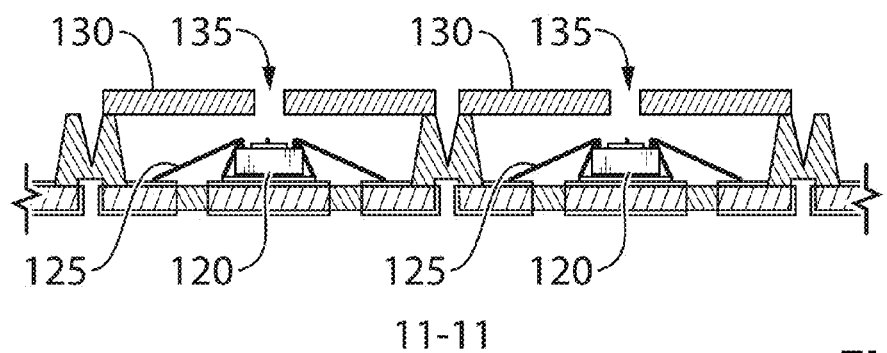
FIG. 11B is a cross sectional view of the sensor package in accordance with the embodiment of FIG. 11A through the line 11-11.

In the present embodiment, the cavities 140 are also covered with an optional lid 130 to protect the sensor packages 100 as shown in FIGS. 11A and 11B. The lid 130 is attached to the top of the strip 145 and covers the opening of the cavity. The material of the lid 130 is not particularly limited and can include various materials depending on the specific sensor package 100. For example, for sensor packages 100 that measure light, the lid 130 can include glass or other transparent materials. In other embodiments, the lid 130 can include a via 135 to expose the active portion of the sensor package 100 to external elements if necessary. The lid 130 is not particularly limited and it is to be appreciated by a person of skill in the art with the benefit of this description that the lid 130 can vary depending on the type of sensor as well as the application. For example, the lid 130 can be rigid for protection or flexible for pressure detection. The lid 130 can also be conductive or non-conductive depending on the desired characteristics for the sensor.

The manner by which the lid 130 is attached over the cavity 140 is not particularly limited. In the present embodiment, the lid is attached by means of an epoxy, such as a B-stage epoxy that can be pre-applied to the lid 130 or strip 145. In other embodiments, ultrasonic welding can be used.

Block 560 involves snapping the lead frame 105 along the score line 165 to separate the sensor packages from adjacent sensor packages. It is to be appreciated by a person of skill in the art with the benefit of this description that the manner by which the sensor packages are singulated is not particularly limited and can include application of force to various portions of the lead frame 105 to stress the structurally weaker score line 165 and V-groove 150. For example, the lead frame 105 can be attached to a jig using a pneumatic or other suitable claim or for alignment followed by applying a bending force on the lead frame 105.

Figure 12A:
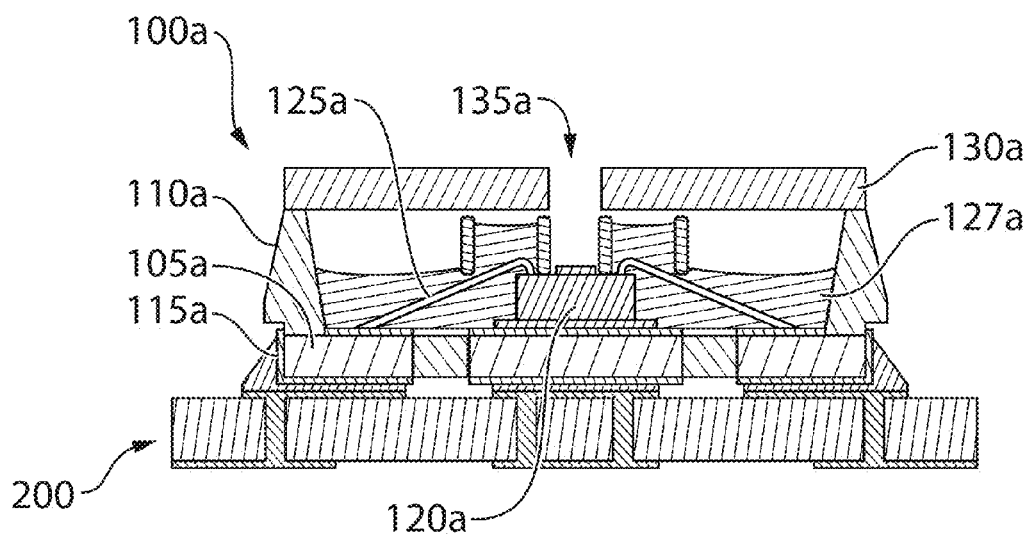
FIG. 12A is a cross sectional view of a sensor package in accordance with another embodiment.
Figure 12B:
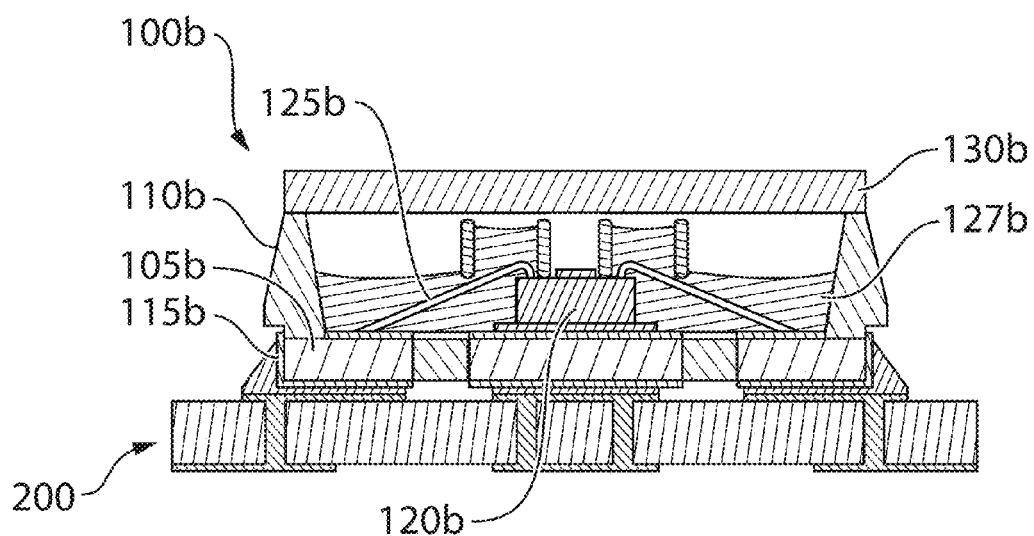
FIG. 12B is a cross sectional view of a sensor package in accordance with another embodiment.

Once separated, the sensor package 100 can be attached to a motherboard 200 as shown in FIGS. 12A and 12B. Although the present embodiments show that the sensor package 100 is connected to a motherboard 200, it is to be appreciated that other applications are contemplated, such as another surface mounted module.

Referring to FIG. 12A, another embodiment of a sensor package is generally shown at 100a. In the present embodiment, like components of the sensor package 100a bear like reference to their counterparts in the sensor package 100, except followed by the suffix "a". In the present embodiment, the sensor package 100a includes a lead frame 105a premolded with an premolding compound 110a, metal plating 115a, a die 120a, at least one wire 125a, an encapsulation polymer 127a, and a lid 130a having a via 135a.

Referring to FIG. 12B, yet another embodiment of a sensor package is generally shown at 100b. In the present embodiment, like components of the sensor package 100b bear like reference to their counterparts in the sensor package 100a, except followed by the suffix "b". In the present embodiment, the sensor package 100b includes a lead frame 105b premolded with an premolding compound 110b, metal plating 115b, a die 120b, at least one wire 125b, an encapsulation polymer 127b, and a lid 130b.

It is to be appreciated that the embodiments shown in FIGS. 12A and 12B are similar with the exception of the lids 130a and 130b. In particular, the lid 130a includes a via 135a for exposing the active portion of the sensor package 100a. In contrast, the lid 130b does not have a via and completely seals the sensor package 100b for additional protection for applications that do not require an exposed sensor element.

Figure 13A:
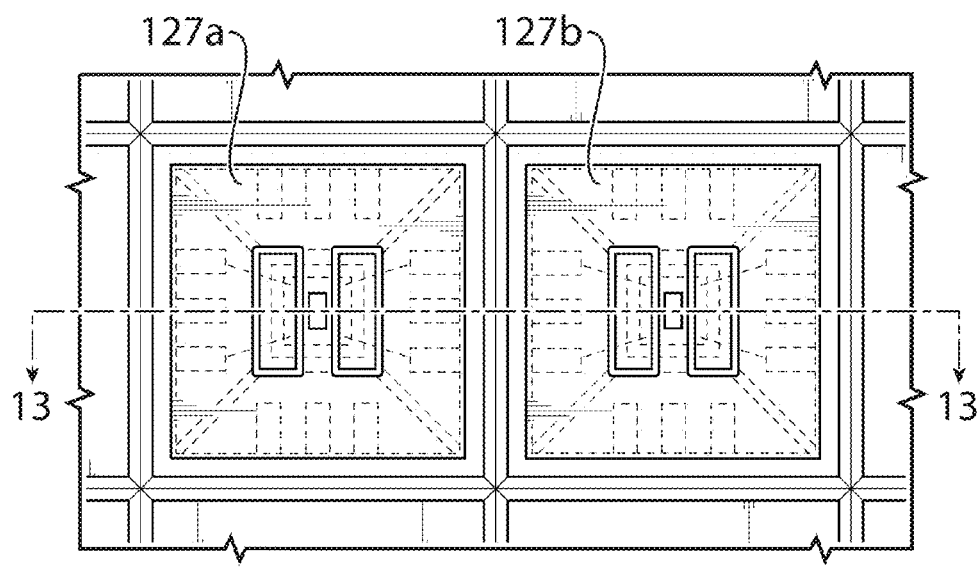
FIG. 13A is a top perspective view of sensor packages with an encapsulation polymer in accordance with an embodiment.
Figure 13B:
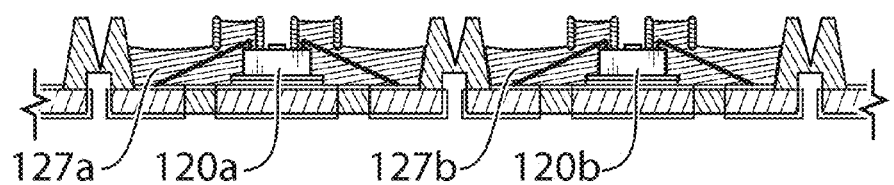
FIG. 13B is a cross sectional view of the sensor package in accordance with the embodiment of FIG. 13A through the line 13-13.
Figure 14A:
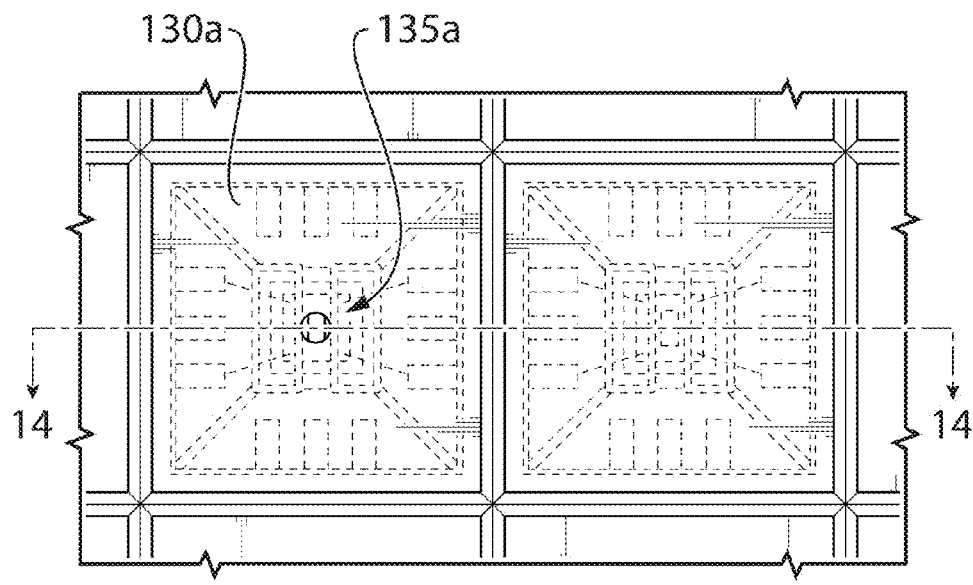
FIG. 14A is a top perspective view of the sensor packages show in FIG. 13A with lids in accordance with an embodiment.
Figure 14B:
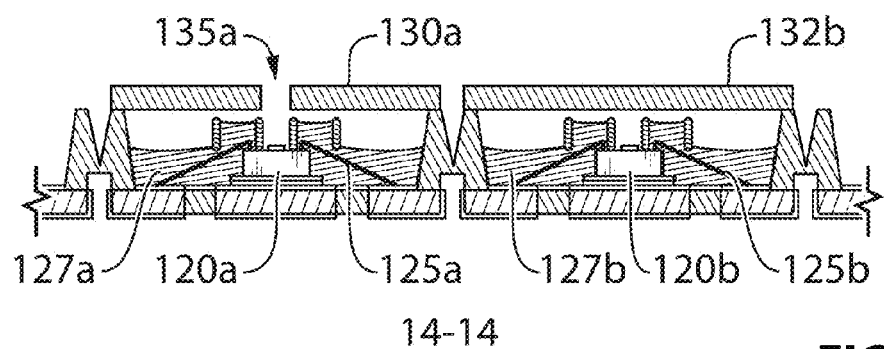
FIG. 14B is a cross sectional view of the sensor package in accordance with the embodiment of FIG. 14A through the line 14-14.

Referring to FIGS. 13A and 13B, the application of the encapsulation polymer 127a and 127b is generally shown. The composition of the encapsulation polymer 127a and 127b is not particularly limited and can include glob-top or silicone material. The manner by which the encapsulation polymer 127a and 127b is applied is also not particularly limited. In addition, as shown in FIGS. 14A and 14B, different lids can be applied to adjacent sensor packages 100a and 100b.

Various advantages will now be apparent to a person of skill in the art. Of note is the ability to assemble sensor packages on a lead frame substrate without cutting the substrate and using a temporary carrier. This can reduce costs by reducing the amount of assembly materials and steps required. In addition, it allows the premold compound to adhere directly to a lead frame, which generally has a roughened surface as compared with applying a premold to a plated lead frame. This improves adhesion of the mold compound to the metal surface an increases package reliability. Yet another advantage is that the cut sidewalls of the score line 165 are plated with a bondable metal to improve reliability at the motherboard level. Various other advantages would also be apparent.

While specific embodiments have been described and illustrated, such embodiments should be considered illustrative only and should not serve to limit the accompanying claims.

What is claimed is:

1. A method of manufacturing a sensor package, the method comprising:
    premolding a lead frame to form a substrate having a plurality of cavities, wherein each cavity includes exposed surfaces, and wherein adjacent cavities of the plurality of cavities are separated with a strip disposed on a first side of the substrate, wherein the strip is formed with a longitudinal groove;
    cutting partially along the strip from a second side of the substrate to form a score line, the second side opposite the first side, such that the adjacent cavities remain connected;
    plating the exposed surfaces with a bondable metal, wherein the exposed surfaces include leads, a die pad and walls of the score line;
    attaching a die to the die pad;
    connecting wires between the die and the leads to form the sensor package; and
    snapping the substrate along the score line to separate the sensor package.

2. The method of claim 1, wherein the lead frame comprises copper.

3. The method of claim 1, wherein the lead frame comprises an iron/nickel alloy.

4. The method of claim 1, wherein premolding comprises applying an epoxy molding compound.

5. The method of claim 1, wherein premolding comprises applying a liquid crystal polymer.

6. The method of claim 1, wherein plating comprises electroless plating.

7. The method of claim 6, wherein the bondable metal comprises at least one of gold, nickel, and silver.

8. The method of claim 1, further comprising attaching a lid to protect the sensor package, the lid supported by the strip.

9. The method of claim 8, wherein attaching the lid comprises using epoxy.

10. The method of claim 8, wherein attaching the lid comprises using ultrasonic welding.

11. The method of claim 8, wherein the lid includes a via for exposing the die of the sensor package to an external environment.

12. The method of claim 1, further comprising applying an encapsulation polymer to protect the wires and the die.

13. A substrate for assembly of sensor packages, the substrate comprising:
    a lead frame;
    a premolding compound premolded to the lead frame defining a plurality of cavities, wherein each cavity includes exposed surfaces, and wherein adjacent cavities of the plurality of cavities are separated with a strip disposed on a first side, wherein the strip is formed with a longitudinal groove;
    a score line cut along the strip from a second side, the second side opposite the first side, wherein the score line is configured to facilitate separation of the sensor packages by snapping; and
    a bondable metal plated onto exposed surfaces of the lead frame, wherein the exposed surfaces include leads, a die pad in each cavity of the plurality of cavities, and walls of the score line, wherein the die pad is configured to receive a die, and wherein the leads are configured to connect to the die using wires.

14. The substrate of claim 13, wherein the lead frame comprises copper.

15. The substrate of claim 13, wherein the premolding compound is an epoxy molding compound.

16. The substrate of claim 13, wherein premolding comprises applying a liquid crystal polymer.

17. The substrate of claim 13, further comprising attaching a lid to protect at least one of the sensor packages, the lid supported by the strip.

18. The substrate of claim 17, wherein the lid includes a via for exposing the die of at least one of the sensor packages to an external environment.

19. The substrate of claim 13, further comprising applying an encapsulation polymer to protect the wires and the die.

20. A substrate of sensor packages, the substrate comprising:
    a lead frame;
    a premolding compound premolded to the lead frame defining a plurality of cavities, wherein each cavity includes exposed surfaces, and wherein adjacent cavities of the plurality of cavities are separated with a strip disposed on a first side, wherein the strip is formed with a longitudinal groove;
    a score line cut along the strip from a second side, the second side opposite the first side, wherein the score line is configured to facilitate separation of the sensor packages by snapping;
    a bondable metal plated onto exposed surfaces of the lead frame, wherein the exposed surfaces include leads, a die pad in each cavity of the plurality of cavities, and walls of the score line;
    a die attached to the die pad; and
    wires connecting the die to the leads.

* * * * *